US009079673B1

(12) United States Patent
Steele et al.

(10) Patent No.: US 9,079,673 B1
(45) Date of Patent: Jul. 14, 2015

(54) ASSEMBLY FOR COLLECTING ELECTROMAGNETIC ENERGY

(71) Applicants: Kenneth Loyd Steele, Carlsbad, CA (US); Theodore Garry Stern, El Cajon, CA (US)

(72) Inventors: Kenneth Loyd Steele, Carlsbad, CA (US); Theodore Garry Stern, El Cajon, CA (US)

(73) Assignee: Alliance SpaceSystems, LLC, San Diego, CA (US)

( * ) Notice: Subject to any disclaimer, the term of this patent is extended or adjusted under 35 U.S.C. 154(b) by 0 days.

(21) Appl. No.: 14/658,043

(22) Filed: Mar. 13, 2015

Related U.S. Application Data

(63) Continuation of application No. 14/546,958, filed on Nov. 18, 2014, now Pat. No. 9,004,410.

(60) Provisional application No. 62/068,501, filed on Oct. 24, 2014.

(51) Int. Cl.
*B64G 1/44* (2006.01)

(52) U.S. Cl.
CPC . *B64G 1/44* (2013.01); *B64G 1/443* (2013.01)

(58) Field of Classification Search
CPC ............ B64G 1/22; B64G 1/44; B64G 1/443; B64G 1/222
See application file for complete search history.

(56) References Cited

U.S. PATENT DOCUMENTS

| | | | | |
|---|---|---|---|---|
| 4,153,474 A * | 5/1979 | Rex | ................................ | 136/246 |
| 4,313,422 A * | 2/1982 | McEntee | ........................ | 126/624 |
| 4,494,302 A * | 1/1985 | Knechtli et al. | .............. | 29/25.02 |
| 4,636,579 A | 1/1987 | Hanak et al. | | |
| 4,690,355 A * | 9/1987 | Hornung et al. | ........... | 244/172.8 |
| 5,019,768 A * | 5/1991 | Criswell et al. | ................ | 322/2 R |
| 5,131,955 A * | 7/1992 | Stern et al. | ..................... | 136/245 |
| 5,223,781 A * | 6/1993 | Criswell et al. | ................ | 322/2 R |
| 5,296,044 A | 3/1994 | Harvey et al. | | |
| 5,344,496 A * | 9/1994 | Stern et al. | ..................... | 136/246 |
| 5,487,791 A | 1/1996 | Everman et al. | | |
| 5,885,367 A * | 3/1999 | Brown et al. | .................. | 136/245 |
| 6,118,067 A * | 9/2000 | Lashley et al. | | |
| 6,177,627 B1 * | 1/2001 | Murphy et al. | ................ | 136/246 |
| 6,983,914 B2 | 1/2006 | Stribling et al. | | |
| 7,301,095 B2 * | 11/2007 | Murphy et al. | ............... | 136/246 |
| 7,368,656 B2 * | 5/2008 | Boulanger | ..................... | 136/246 |
| D597,930 S * | 8/2009 | Kato | ............................ | D13/102 |
| 7,806,370 B2 | 10/2010 | Beidleman et al. | | |
| 2014/0150863 A1 | 6/2014 | Spence et al. | | |

* cited by examiner

*Primary Examiner* — Philip J Bonzell
(74) *Attorney, Agent, or Firm* — Manuel de la Cerra

(57) ABSTRACT

A retractable and re-deployable assembly is provided for collecting electromagnetic energy, for instance in outer space. The assembly has two layers: a first layer comprising a substrate and a second layer comprising an array of electromagnetic transducers. The second layer may further include a plurality of panels, each of which has a proximal edge and a distal edge opposite to the proximal edge. The panels also have a reflective surface and opposite the reflective surface a collector surface on which the array of electromagnetic transducers is disposed. The panels may be flexible and preformed to a cylindrical parabolic shape such that when this embodiment is in the deployed configuration, the edge of the panel curls away from the substrate layer because of the pre-formed parabolic shape, thus helping focus the energy on the transducers.

13 Claims, 12 Drawing Sheets

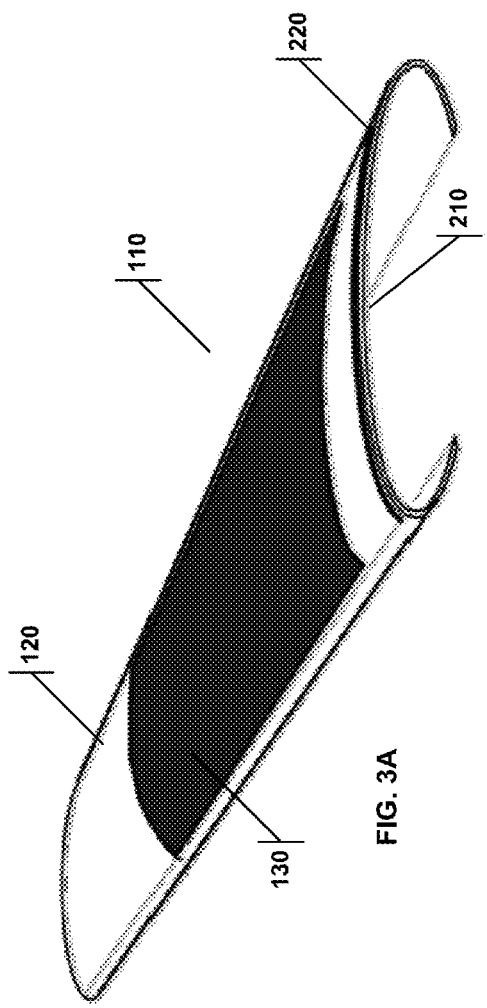
FIG. 3A
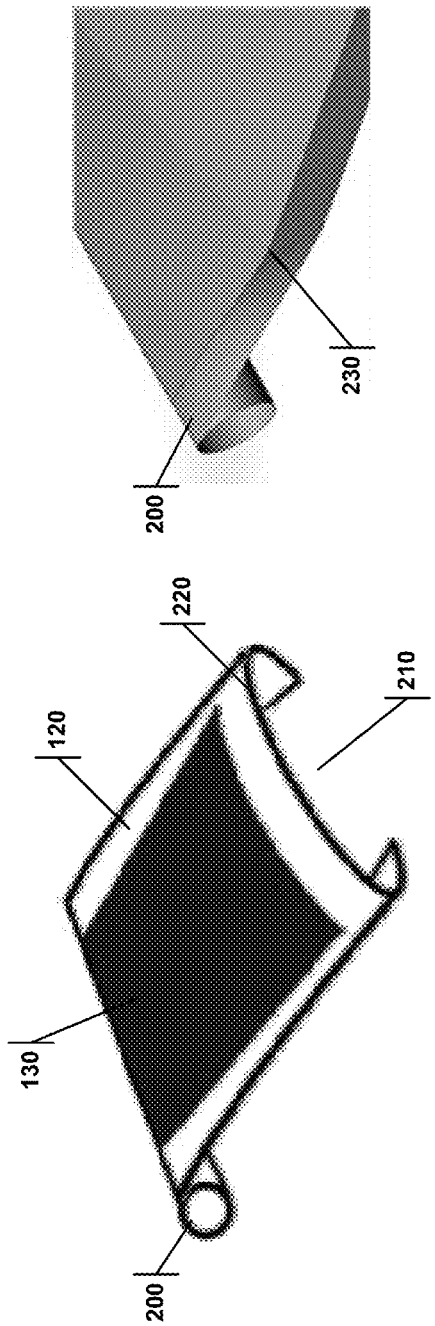
FIG. 3C
FIG. 3B

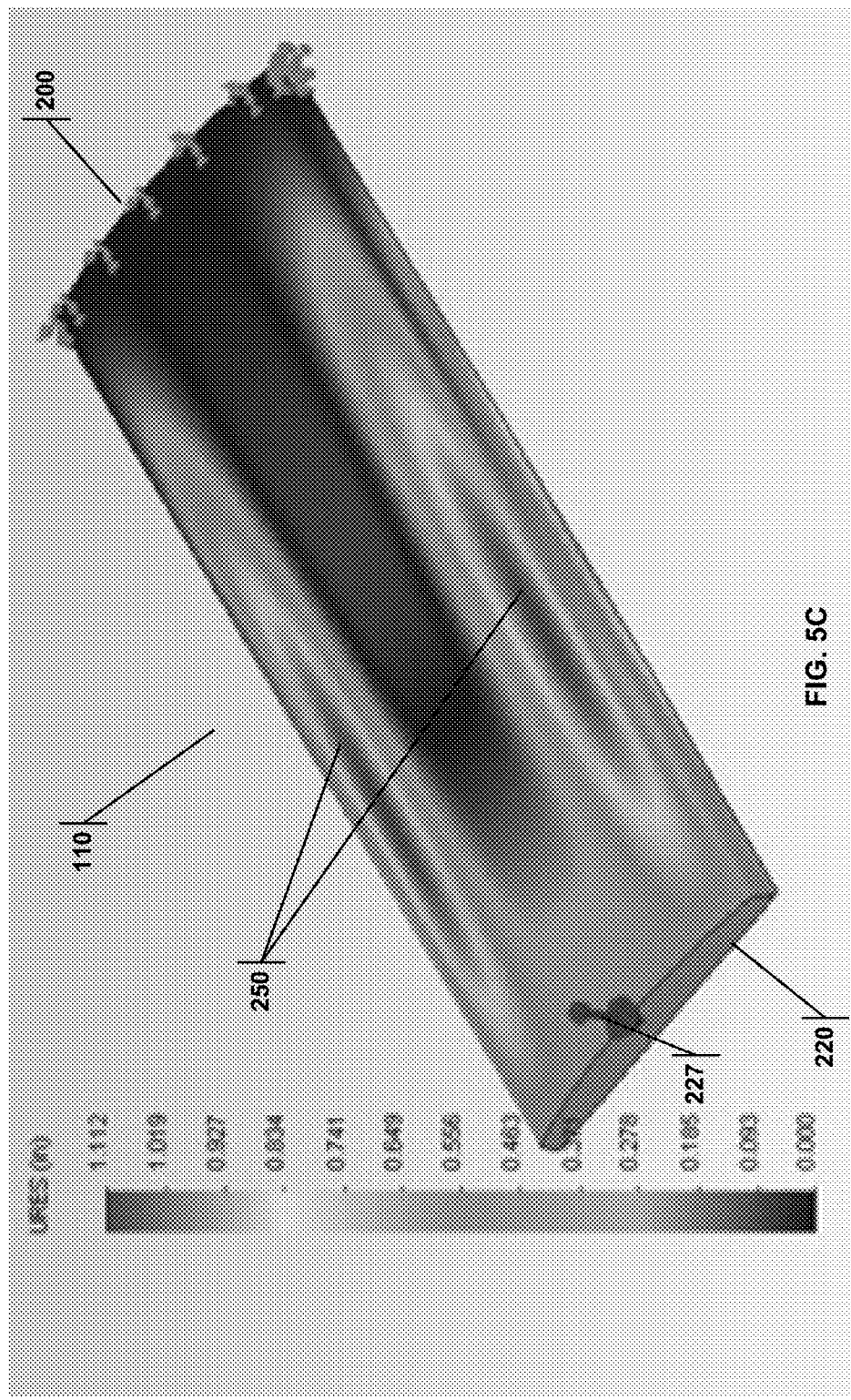

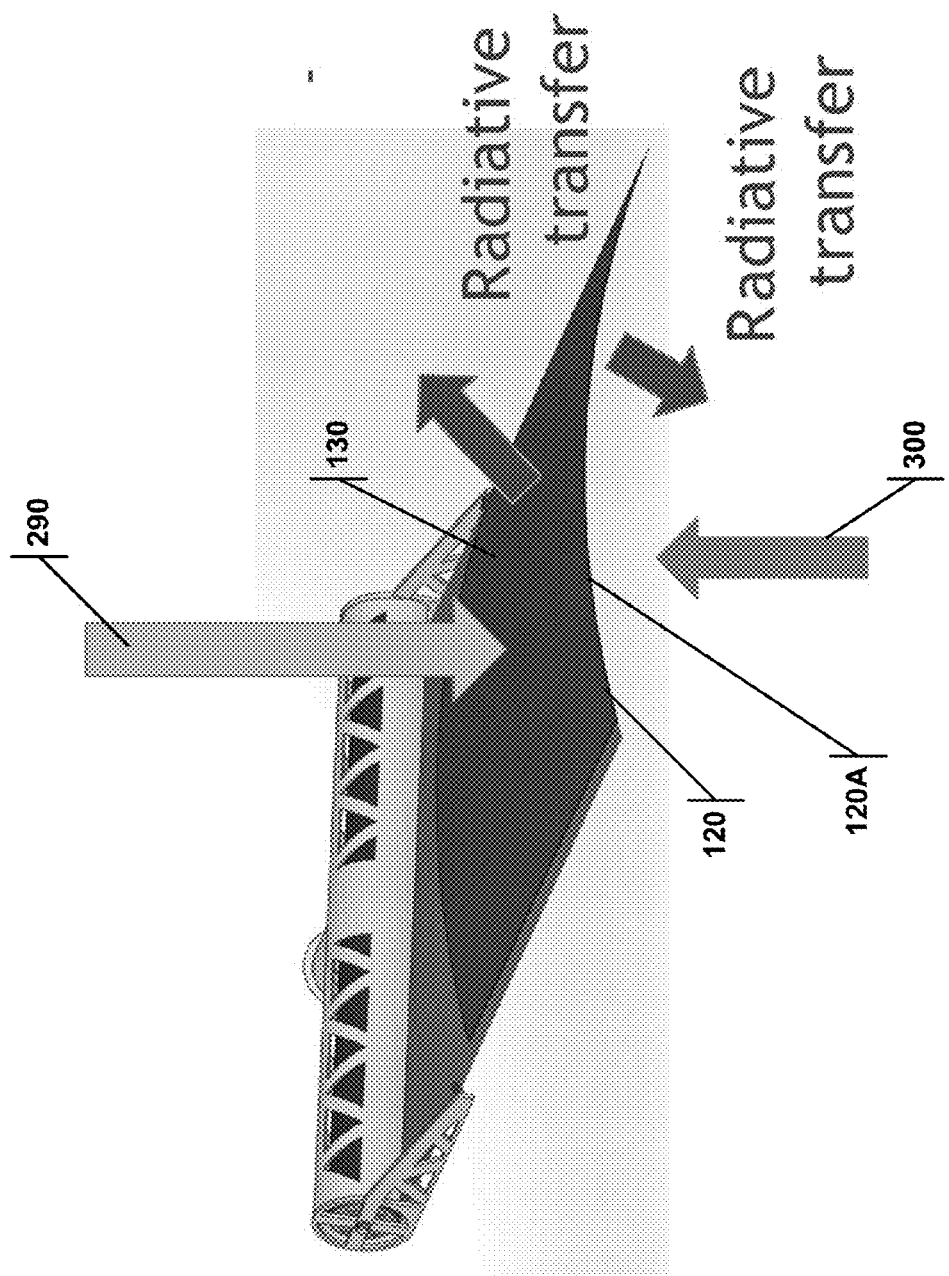

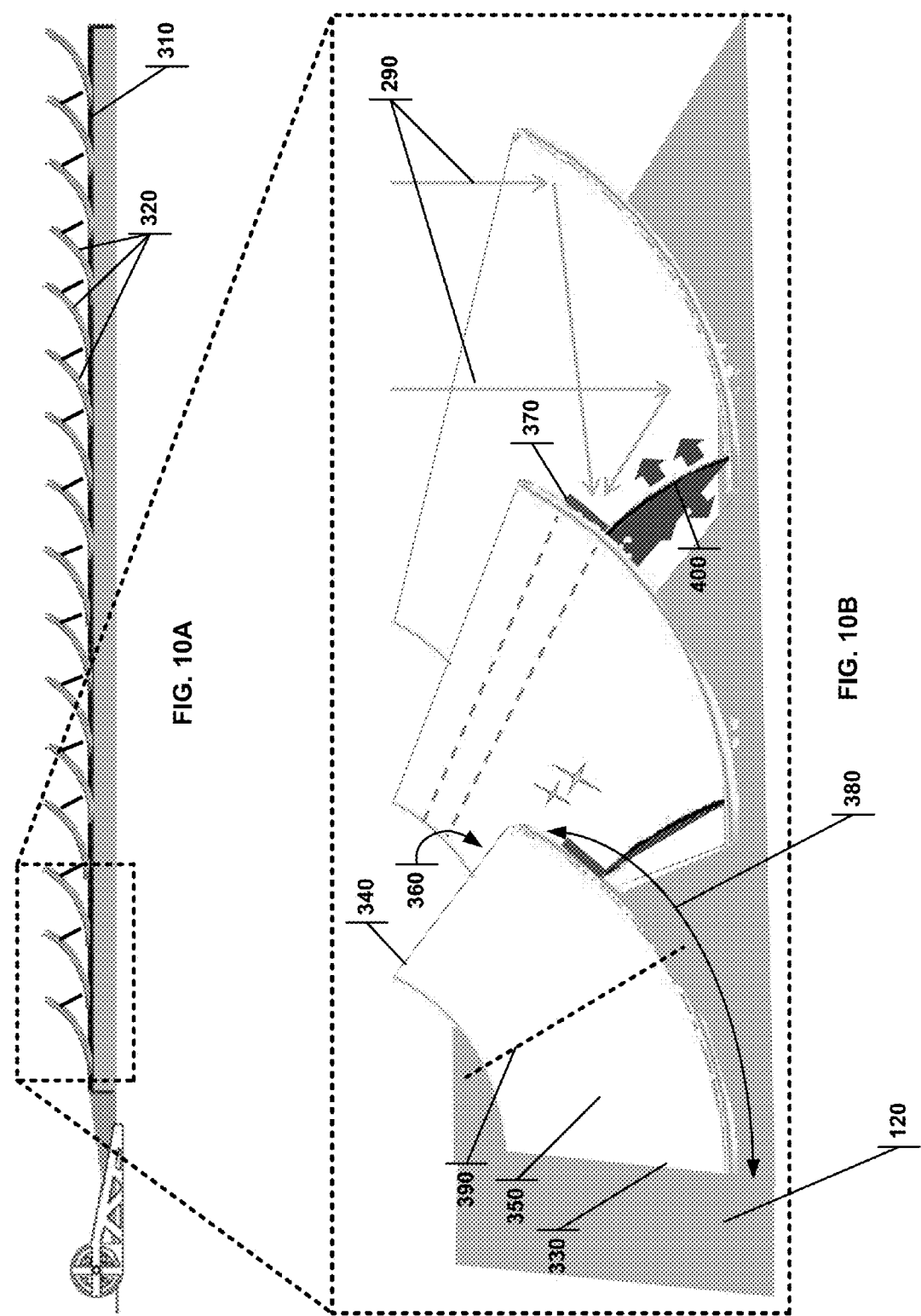

ASSEMBLY FOR COLLECTING ELECTROMAGNETIC ENERGY

1.0 CROSS-REFERENCE TO RELATED APPLICATIONS

This application claims priority to and is a non-provisional of U.S. Patent Ser. No. 62/068,501 filed on Oct. 24, 2014, and as a continuation application to U.S. patent Ser. No. 14/546,958 filed on Nov. 18, 2014. The contents of these patent applications are incorporated herein by reference.

2.0 FEDERALLY SPONSORED RESEARCH OR DEVELOPMENT

None.

3.0 TECHNICAL FIELD

The present invention relates to assemblies for collecting electromagnetic energy.

4.0 BACKGROUND

Solar photovoltaic arrays are commonly used to power spacecraft. Spacecraft needing high power generation typically use solar array wings that fold or roll-up for launch (because of the constraints of available volume within the launch vehicle), then unfold or unroll in space to present a large solar collection area as-needed to intercept sufficient sunlight to generate the required power. A common approach is to mount the solar cells onto rigid panels, accordion-fold the panels for stowage, and subsequently deploy them in space using hinges between the panels and a supplied deployment force. The common approach has limitations in how compactly the arrays can be packaged, because of the inherent volume and inflexibility of the rigid panels that are used as mounting substrates for the photovoltaic assemblies.

To overcome the packaging limitations of rigid panels, reduce mass, and reduce packaged volume, a Solar Cell Blanket is often used. A Solar Cell Blanket may comprise a thin, flexible assembly of solar cells, coverglass, interconnects, terminal strips, and insulating film that may be unsupported, instead of mounted on thick rigid panel structures. These thin flexible membranes are normally supplemented with a separate deployable super-structure or scaffold that provides the means to deploy the folded or rolled-up solar array into its final deployed configuration and to provide the structural rigidity to hold the deployed array, since the flexible membrane is not a rigid structure. The deployed super-structure is typically attached to an orientation device on a spacecraft so as to allow the solar array to be pointed towards the sun. The super-structure also allows the array to withstand the structural loads that may be placed on the deployed array during spacecraft operations, including loads from accelerations that occur during the spacecraft's operating life, including orbital and orientation maneuvers.

Prior methods to provide the super-structure for a flexible membrane deployable solar array typically use umbrella-like, or oriental-fan-like structures to deploy and maintain the structure of a circular solar array, or one or two deployable booms to deploy a rolled or folded rectangular array. The solar arrays found on the Space Station and on the Hubble telescope are examples of rectangular arrays that use a single deployable boom or a pair of deployable booms, respectively, to deploy a flexible solar array and provide deployed structural rigidity. Such flexible membrane solar arrays with discrete and separate super-structures are limited in the shielding provided to the backside of the solar array after deployment, and by the complexity of deploying such an array with tensioning interfaces between the deployable boom and the non-structural solar array blanket. Accordingly, there has long been a need for an improved system that overcomes these and other limitations.

5.0 SUMMARY

Provided is an elegant solution addressing the above issues and providing numerous additional benefits and advantages as will be apparent to persons of skill in the art. In one aspect, an assembly is provided for collecting electromagnetic energy. The assembly may have two layers: a first layer comprising a substrate and a second layer comprising an array of electromagnetic transducers. The assembly may have a stowed or deployed configuration. The second layer may further include a plurality of panels, each of which has a proximal edge and a distal edge opposite to the proximal edge. The panels also have a reflective surface and opposite the reflective surface a collector surface on which the array of electromagnetic transducers is disposed. The panels may be flexible and pre-formed to a cylindrical parabolic shape such that when this embodiment is in the deployed configuration, the edge of the panel curls away from the substrate layer because of the pre-formed parabolic shape. This helps focus the energy on the transducers. A radiator fin may be used to radiate heat away from the transducer, thus reducing the operating temperature of the transducer and increasing its efficiency.

In various example embodiments the assembly may also have a stowed configuration characterized by shielding a majority of the second layer from electromagnetic energy. The assembly can also include a mechanism that that transforms the assembly from the stowed configuration to the deployed configuration. The second layer may be positioned such that a portion of the array of electromagnetic transducers is exposed to electromagnetic energy in the stowed position.

In various example embodiments the electromagnetic transducers may be any or all of photovoltaic cells, antennas, optical sensors, thermal sensors. The substrate may also provide protection to the array of electromagnetic transducers, shielding them from electromagnetic energy or space objects. The substrate may be formed from fiberglass, metal, plastic, graphite composite materials, or any other suitable material.

Further provided in various example embodiments is a method of using the assembly. The method may include actuating the mechanism to place the assembly in the deployed configuration, and then actuating the mechanism to place the assembly in the stowed configuration. This may helpful, for example, when re-positioning the spacecraft when the deployed assembly may adversely affect the ability to accurately position the spacecraft. Conversely, the spacecraft may use the assembly as a sail to assist with positioning. If the spacecraft experiences severe environmental conditions such as a solar storm or space debris, the method allows the assembly to be temporarily placed into a stowed position until the crisis has been weathered.

The foregoing summary of various aspects of certain example embodiments is illustrative only and is not meant to be exhaustive. Other aspects, objects, and advantages of this invention will be apparent to those of skill in the art upon reviewing the drawings, the disclosure, and the appended claims.

6.0 BRIEF DESCRIPTION OF THE DRAWINGS

Various aspects of certain example embodiments can be better understood with reference to the following figures. The components shown in the figures are not necessarily to scale, emphasis instead being placed on clearly illustrating example aspects and features. In the figures, like reference numerals designate corresponding parts throughout the different views and embodiments. Certain components and details may be omitted from the figures to improve clarity.

FIG. 3A is an isometric view of an example lenticular substrate, shown fully deployed.

FIG. 3B is a first isometric view of the example lenticular substrate of FIG. 3A, shown partially deployed and partially spooled.

FIG. 3C is a second isometric view of the example lenticular substrate of FIG. 3A, shown partially deployed and partially spooled.

FIG. 5C is a model illustrating the static displacement of the example deployable lenticular substrate of FIG. 4, when in a deployed configuration.

FIG. 9 is a diagram depicting electromagnetic energy as it reaches an example deployable boom for collecting electromagnetic energy.

FIG. 10A is a side view of another example embodiment of a deployable boom assembly for collecting electromagnetic energy, wherein the boom comprises a plurality of parabolic-shaped panels.

FIG. 10B is an enlarged isometric view of a portion of the example deployable boom assembly of FIG. 10A.

7.0 DETAILED DESCRIPTION OF EXAMPLE EMBODIMENTS

Following is a written description illustrating various aspects of non-limiting example embodiments. These examples are provided to enable a person of ordinary skill in the art to practice the full scope of the invention, including different examples, without having to engage in an undue amount of experimentation. As will be apparent to persons skilled in the art, further modifications and adaptations can be made without departing from the spirit and scope of the invention, which is limited only by the claims.

In the following description, numerous specific details are set forth in order to provide a thorough understanding. Particular example embodiments may be implemented without some or all of the disclosed features or specific details. Additionally, to improve clarity of the disclosure some components well known to persons of skill in the art are not described in detail.

7.1 Deployable Boom Assembly

Figure 1:
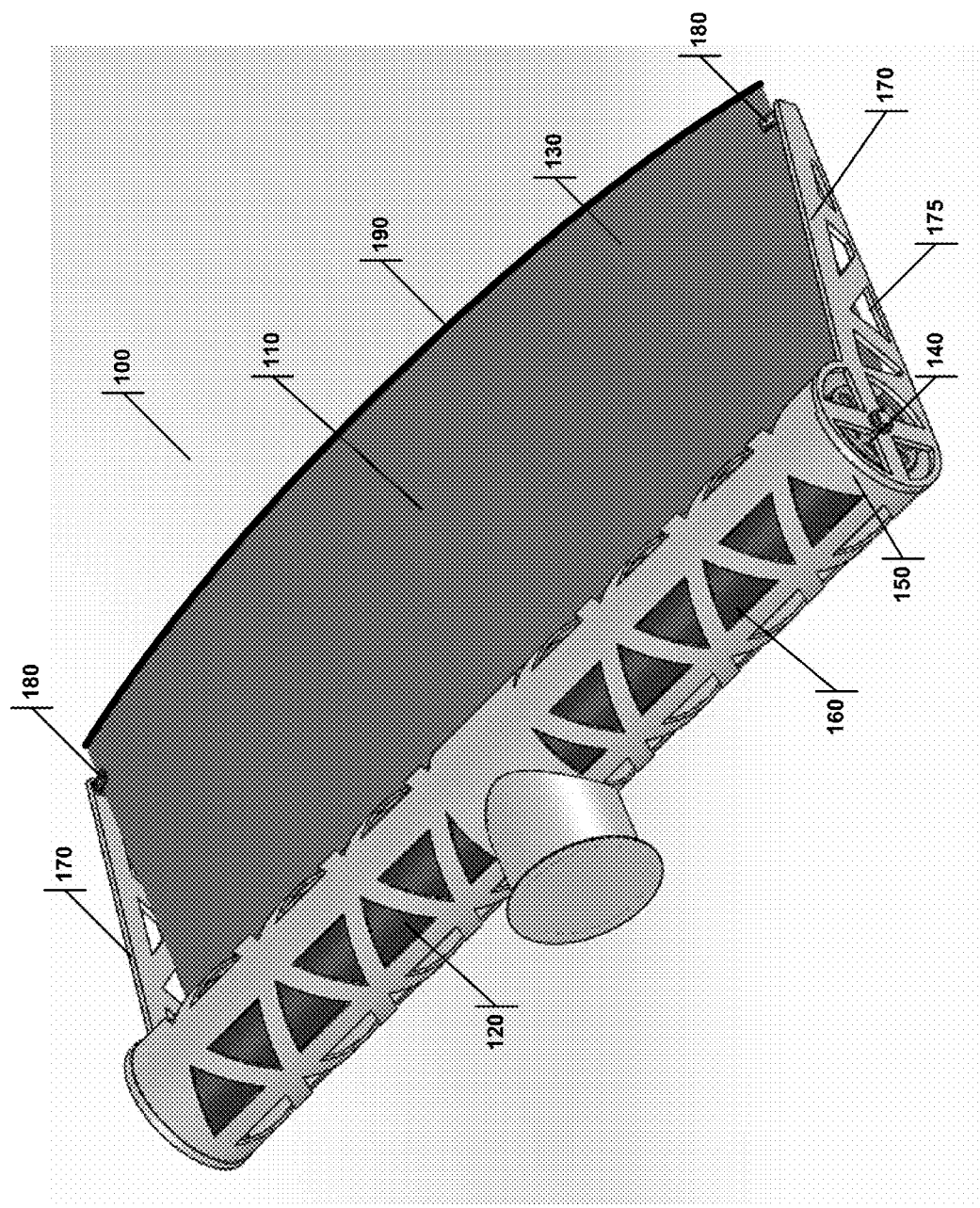
FIG. 1 is an isometric view of an example deployable boom assembly for collecting electromagnetic energy.
Figure 2:
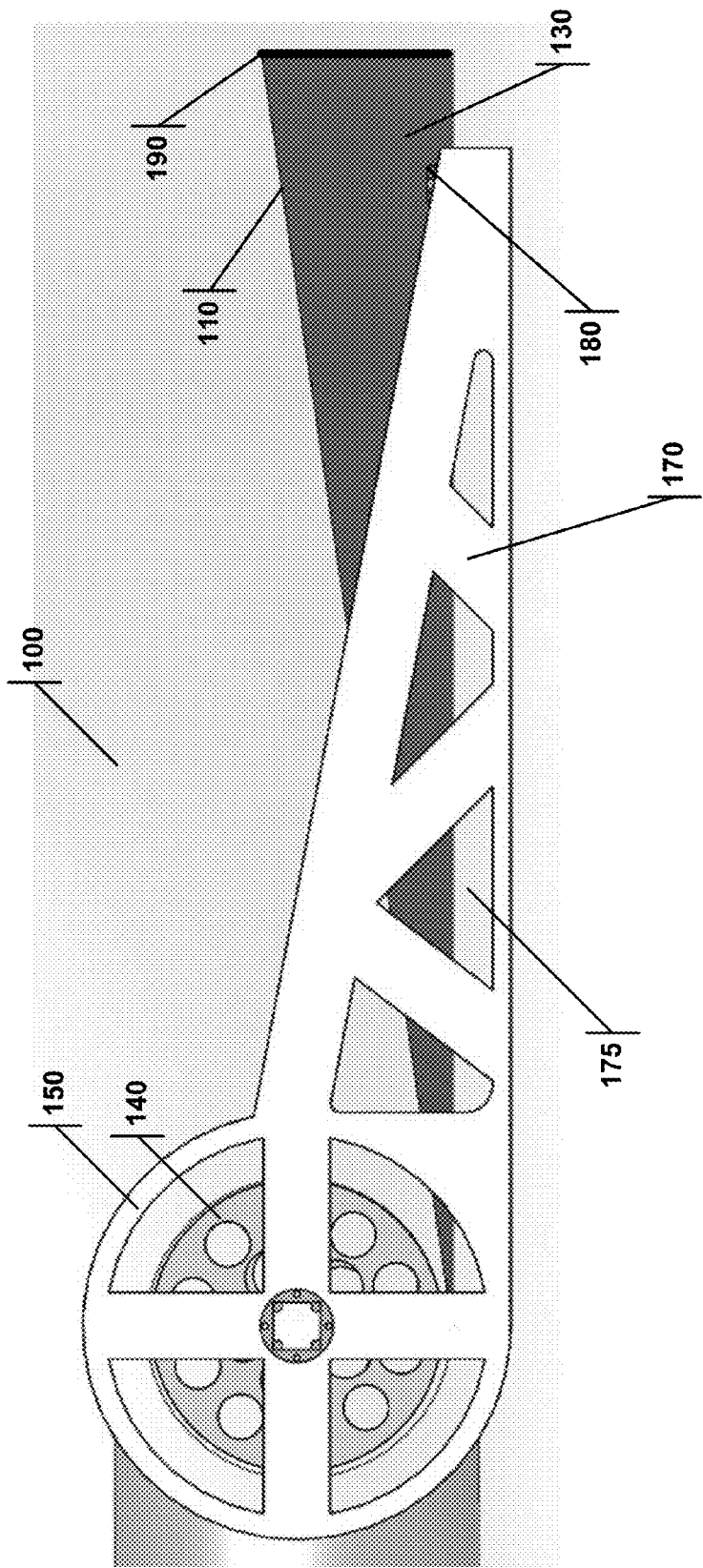
FIG. 2 is a side view of the example deployable boom assembly of FIG. 1.

Referring to FIGS. 1 and 2, an example deployable boom assembly 100 is shown. The assembly 100 includes a boom 110 that includes two layers: a first layer 120 made of a flexible substrate formed in a lenticular shape that can elastically deform (first layer 120 is shown in FIG. 1 as the darker underside when the boom 110 is wound about a spool 140), and a second layer 130 comprising an array of electromagnetic transducers (not shown) adapted to collect electromagnetic energy that impinges on second layer 130 from the surrounding environment, namely outer space. The second layer 130 may be bound to the first layer by fasteners or adhesives. The structure of these two layers 120, 130 is discussed in more detail below with regards to FIGS. 6A, 6B, and 7. The example assembly 100 shown in FIGS. 1 and 2 includes a spool 140 about which the boom 110 can be wound. To protect the boom 110 from environmental hazards when retracted, the assembly 100 may further comprise a housing 150 in which the spool 140 may reside. The housing 150 may comprise a body defining various cutouts 160 provided to reduce the weight of the assembly 100.

The housing 150 may be connected to or form part of a frame 170 that extends away from the housing 150, and the frame 170 may also have weight-saving cutouts 175. The frame 170 may comprise one or more guides 180 adapted to guide the boom 110 as it extends and retracts relative to the frame 170 during deployment. The guides 180 may be adapted to maintain the lenticular shape of the deployed boom 110. To further assist in maintaining the lenticular shape of the deployed boom 110, a cover, cap, rail, or other stiffening member 190 may be provided on a distal portion of the boom 110. The lenticular shape of the deployed boom 110 tends to increase its rigidity.

7.2 Stiffness, Strength, and Flexibility of an Example Lenticularly-Shaped Boom

FIGS. 3A, 3B and 3C illustrate the flexibility and lenticular shape of the boom 110. A first aspect of the substrate or first layer 120 (shown as the lighter layer, the darker second layer 130 comprising an array of electromagnetic transducers) is that it is sufficiently flexible that it can be elastically deformed, for example, by winding its proximal edge 200 about a spool 140 (FIG. 1) as shown in FIGS. 3B and 3C. When the substrate 120 is so deformed, it stores strain energy that may be used to deploy the boom, as discussed below. A second aspect of the substrate 120 is that it is preformed into a lenticular shape 210. So when the boom 110 is deployed, the distal end 220 of the boom 110 returns to a lenticular shape 210, thus providing structural rigidity to the boom 110 upon the boom's 110 deployment. As shown in FIG. 3C, there is a transition zone 230 in the boom 110 between its proximal edge 200, deformed to be flat by being wound about a spool 140, and the distal end 220 that is free to return to its undeformed, lenticular shape 210. It should be noted that shown in FIGS. 3A, 3B and 3C is a more severe lenticular shape that sweeps over more than 180-degrees of an ellipse. In FIGS. 1, 2, 4, 5A, 5B, 5C and 9 the lenticular shape is less than 180-degrees of an ellipse. It would be apparent that various lenticular shapes may be used, provided that that shape provides rigid structural support to the boom 110.

Figure 4:
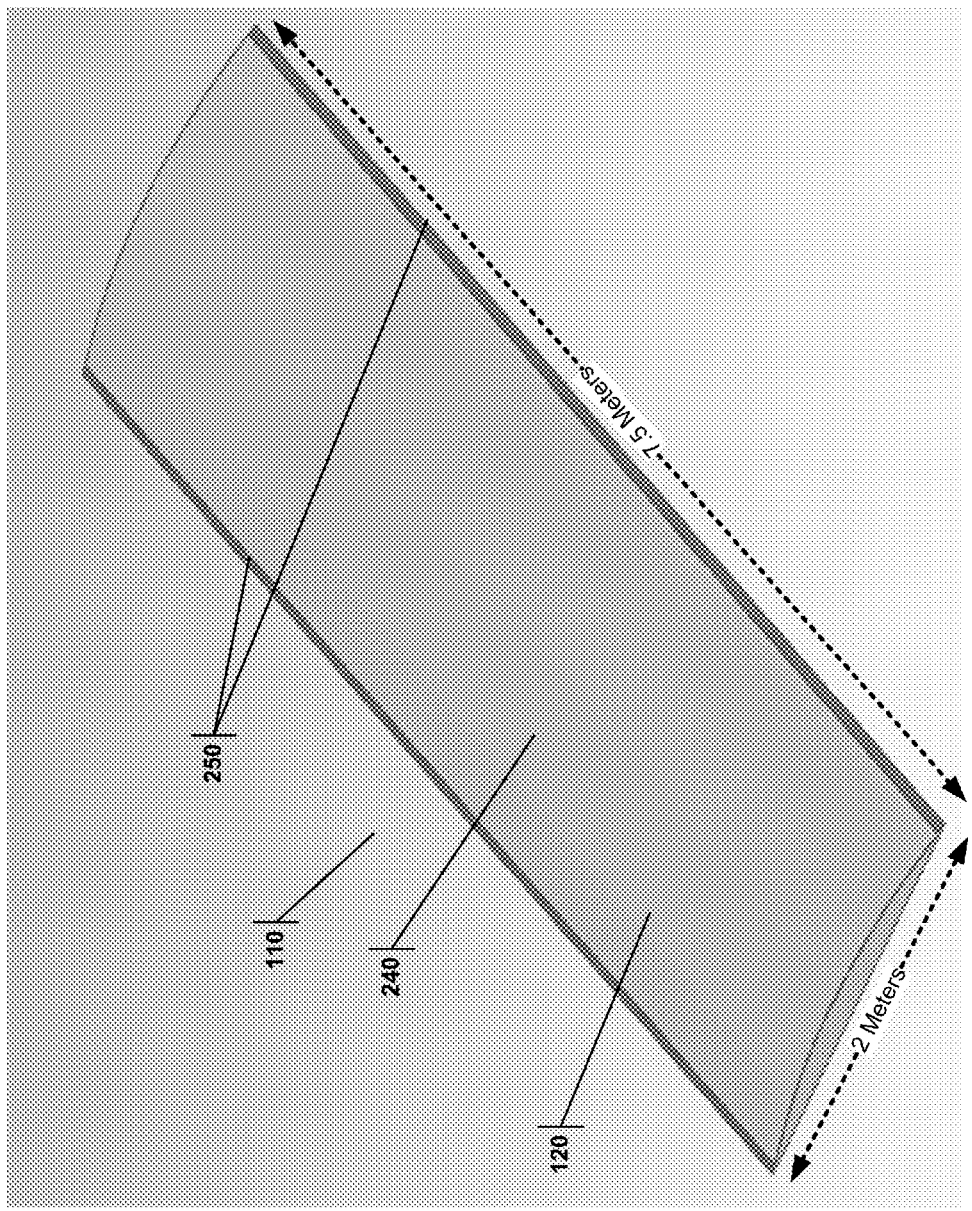
FIG. 4 is an isometric view of an example embodiment of a deployable lenticular substrate.

FIG. 4 illustrates an example embodiment of a deployable boom 110. The boom 110 may in one example embodiment extend longitudinally 7.5 meters (in length) and extend latitudinally 2 meters (in width), for instance. In various example embodiments the substrate layer 120 may be formed from a graphite fiber reinforced composite that may be approximately 10 mils thick, for example, in a central region 240. The central region 240 may be where the electromagnetic transducers (not shown) reside. The outer side edges 250 of the substrate 120 may comprise a stiffer material, such as a 2-inch wide strip of 30 mil-thickness graphite fiber reinforced composite, for example. A boom 110 as described in this paragraph and shown in FIG. 4 was modeled on a computer to determine if it would be structurally sound according to the following evaluation criteria: (1) Stiffness (>0.10 Hz deployed); (2) Strength (1 milli-g deployed flight loading); and (3) Stability (1 milli-g deployed flight loading). The results of this computer modeling are illustrated in FIGS. 5A, 5B, and 5C and are discussed below.

Figure 5A:
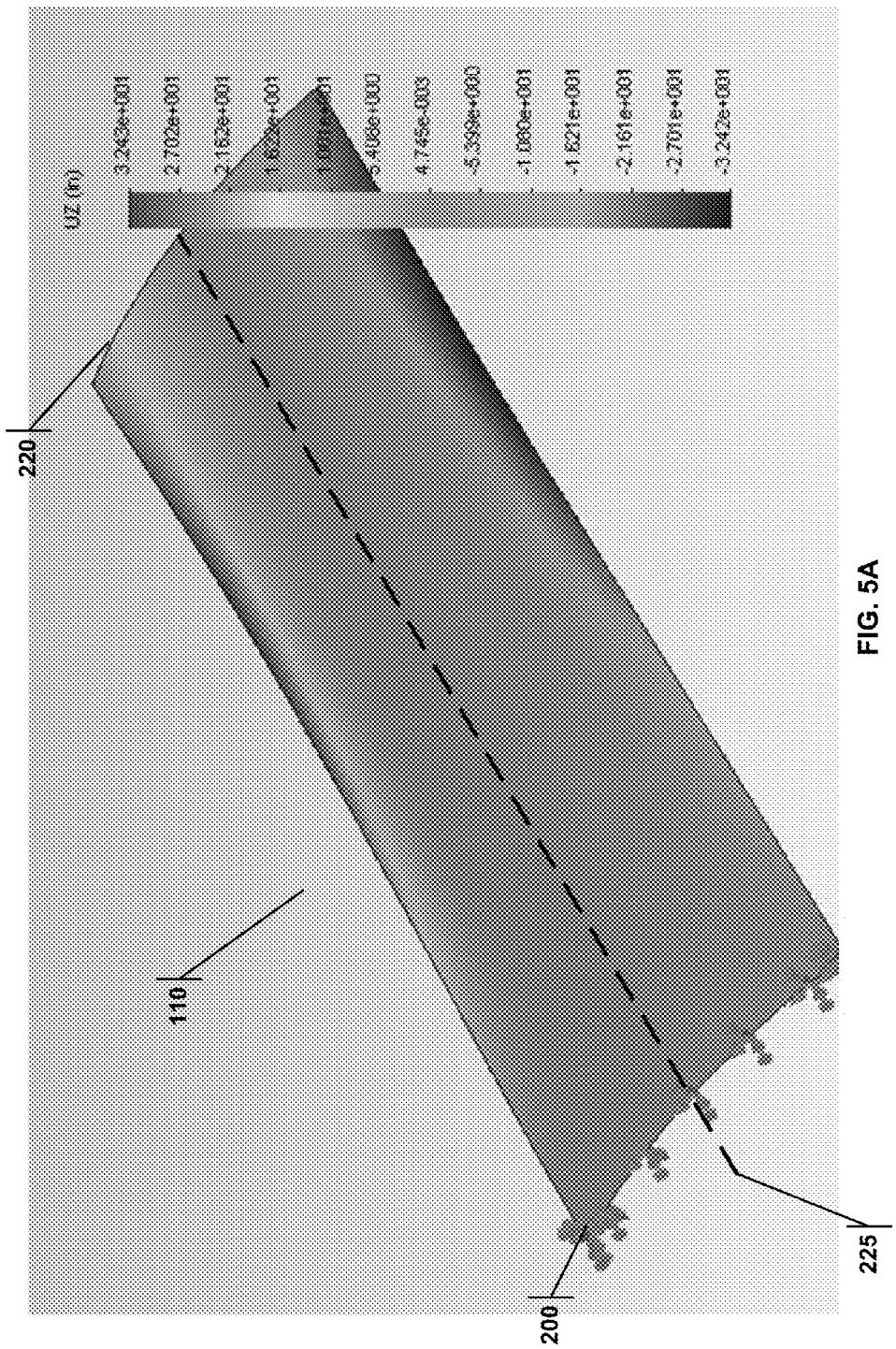
FIG. 5A is a model illustrating the first order natural frequency of the example deployable lenticular substrate of FIG. 4, when in a deployed configuration.

FIG. 5A reports the first mode deflected shape of the example boom 110 described above. The computer model yielded a frequency of this mode of 0.93 Hz, which is over nine-fold better than the evaluation criterion. Note that the displacement legend only describes the deflected shape of the first mode, not displacement due to any load condition. As shown in FIG. 5A, the first mode deflected shape is torsion (twist) about the boom's longitudinal axis 225.

Figure 5B:
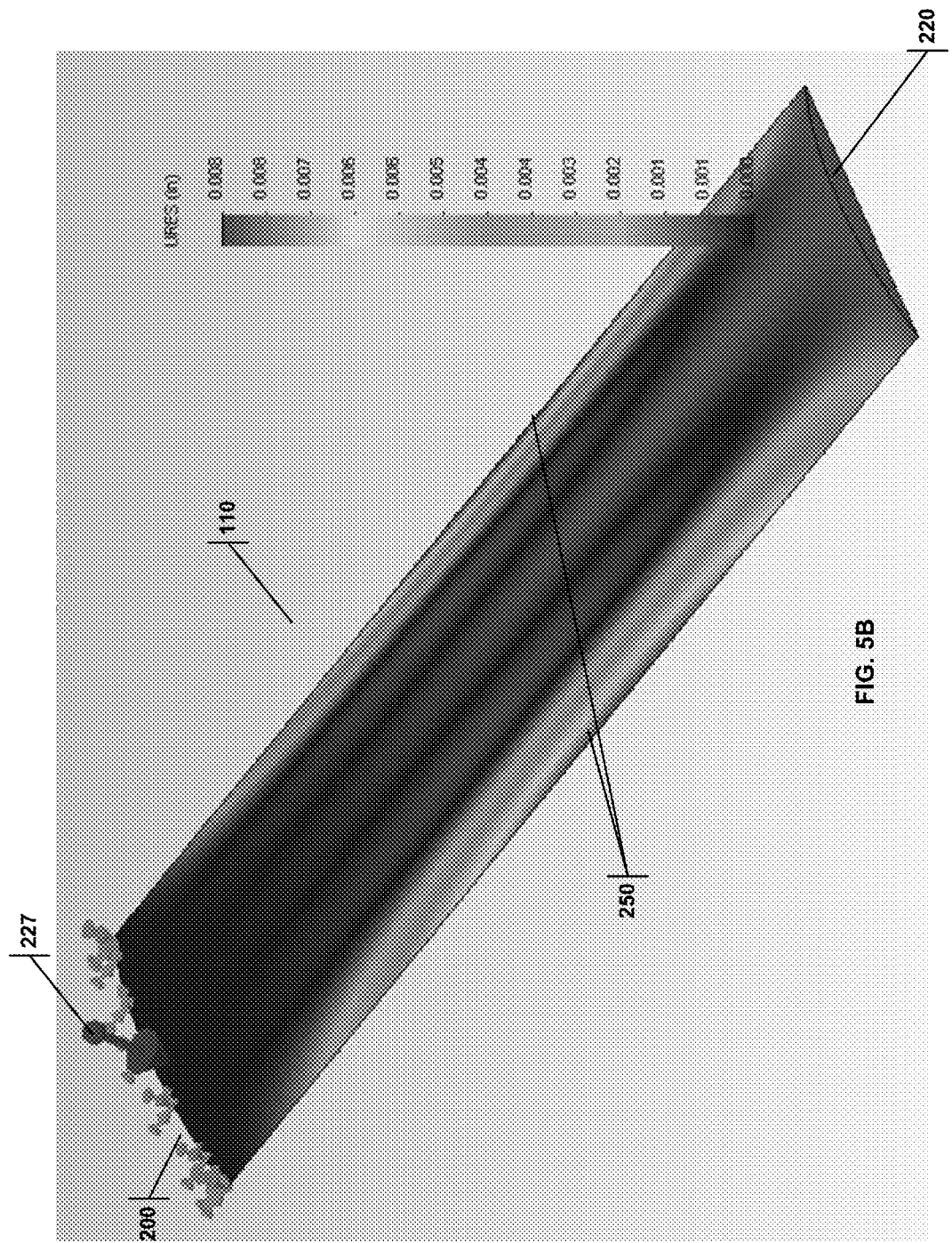
FIG. 5B is a model illustrating the static displacement of the example deployable lenticular substrate of FIG. 4, when in a deployed configuration.

FIG. 5B reports the modeled static displacement for a uniform 1 milli-g deployed flight loading as provided in the evaluation criteria. Note that the arrow 227 only illustrates the direction of the uniform acceleration, not the location. The entire boom was subjected to the uniform 1 milli-g acceleration. The resulting displacement was found to be a maximum of 8 mils/milli-g, which is a negligible value relative to spacecraft maneuvering operations. The boom's maximum stress for this loading condition was less than 8 ksi which results in a strength factor of safety of greater than three, which easily satisfies the strength evaluation criterion of 1 milli-g loading.

Next, FIG. 5C illustrates the buckling mode deflected shape (modeshape) under uniform acceleration. Note that the displacement legend only describes the deflected shape of the first mode, not displacement due to any load condition. The arrow 227 only illustrates the direction of the uniform acceleration, not the location. The entire boom was subjected to a uniform 28 milli-g acceleration before buckling occurred. This exceeds the evaluation criterion of stability (i.e., 1 milli-g loading) by 28-fold.

These results unequivocally indicate that booms 110 can be readily be designed to perform as required in space, even after applying a common safety factor of 3. Moreover, the computer model only considered the first layer or substrate 120, and did not account for the additional stiffening and strengthening that the second layer 130 of electromagnetic transducers will provide to the boom 110. It will be apparent to those of skill in the art that various alternative materials may be used for the substrate 120, including fiberglass, metal, plastic and graphite composite materials, or combinations thereof, for example. It should also be noted that any suitable dimensions can be used for the boom 110, except where specifically recited in the claims.

7.3 Stowed and Deployed Configurations of an Example Assembly

Figure 6A:
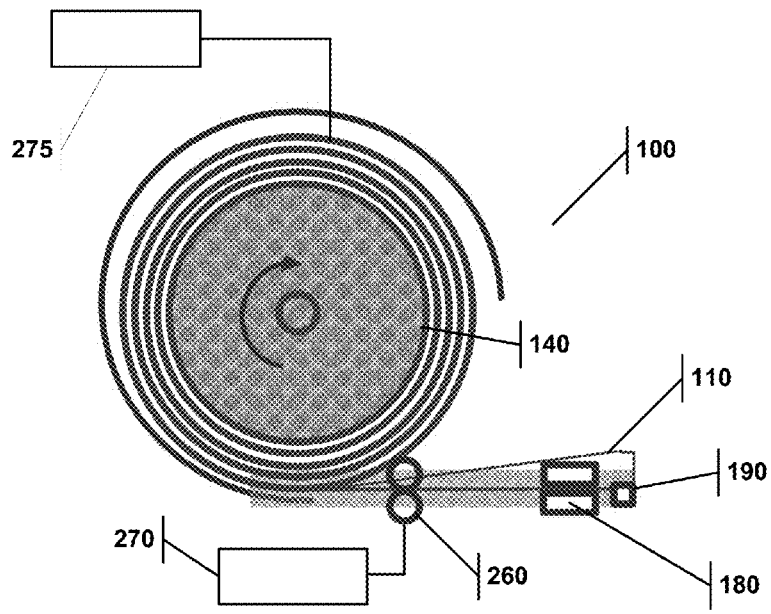
FIG. 6A is a side view of an example deployable boom assembly for collecting electromagnetic energy, shown in the stowed or spooled configuration.

FIG. 6A illustrates an example assembly 100 in a stowed configuration, with a boom 110 wound about a spool 140. One or more powered traction rollers 260 may be provided in frictional contact with the boom 110 to help stow or deploy the boom 110. The traction rollers 260 may be connected with one or more rotational drive mechanisms 270 such as a motor, spring, or other source of rotational energy. Alternatively or in addition thereto, the one or more rotational drive mechanisms 270 may provide rotational power to the spool 140. The rotational drive mechanism 270 may be adapted to assist in transitioning the assembly 100 between stowed (FIG. 6A) and deployed (FIG. 6B) configurations. It should be noted that when the boom 110 is deformed, for example flattened through spooling into the stowed configuration of FIG. 6A, it stores strain energy (like a compressed spring) that may later be used to help the assembly 100 transition from the stowed configuration of FIG. 6A back to the deployed configuration of FIG. 6B. In other words, the resilient tendency of the boom 110 to "curl up" about its longitudinal axis into a lenticular cross-section tends to apply forces to various parts of the 100 assembly that urge the boom 110 to unwind from the spool 140 and thus transition from the stowed configuration of FIG. 6A to the deployed configuration of FIG. 6B.

The assembly 100 may also comprise one or more energy transferring devices 275 in electrical communication with the array of electromagnetic transducers 130 so that the electromagnetic energy collected therein can be accessed. These transferring devices 275 may include one or more of a rotary flex harness, slip rings and a twist capsule, for example. While the electromagnetic transducers 130 have been discussed herein as photovoltaic cells, the transducers may also or alternatively comprise antennas, optical sensors, thermal sensors, or any other type of transducer that could benefit from being combined with a lightweight boom extension assembly 100.

Figure 6B:
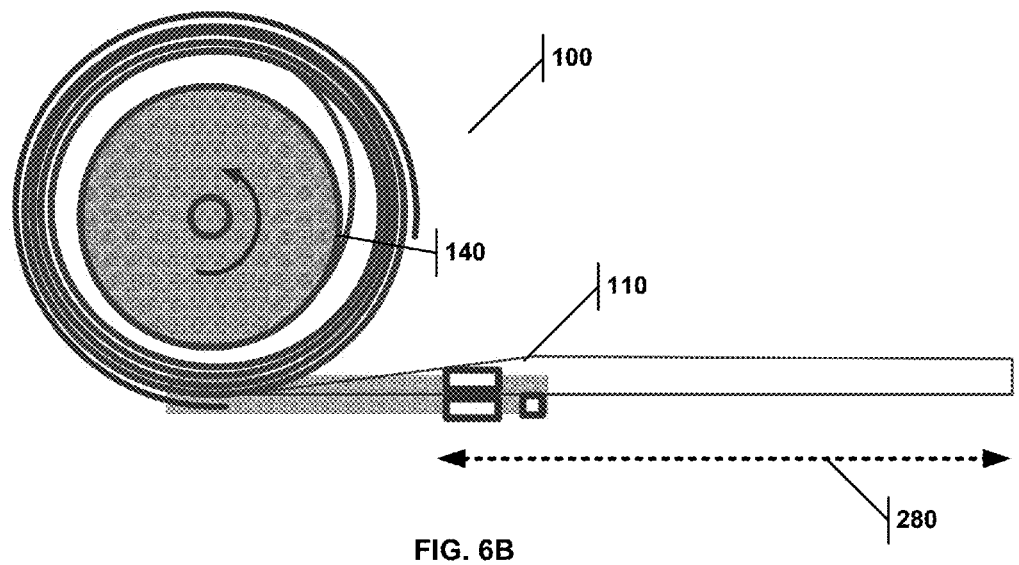
FIG. 6B is a side view of the example deployable boom assembly of FIG. 6A, shown in the deployed configuration.
Figures 7A, 7B:
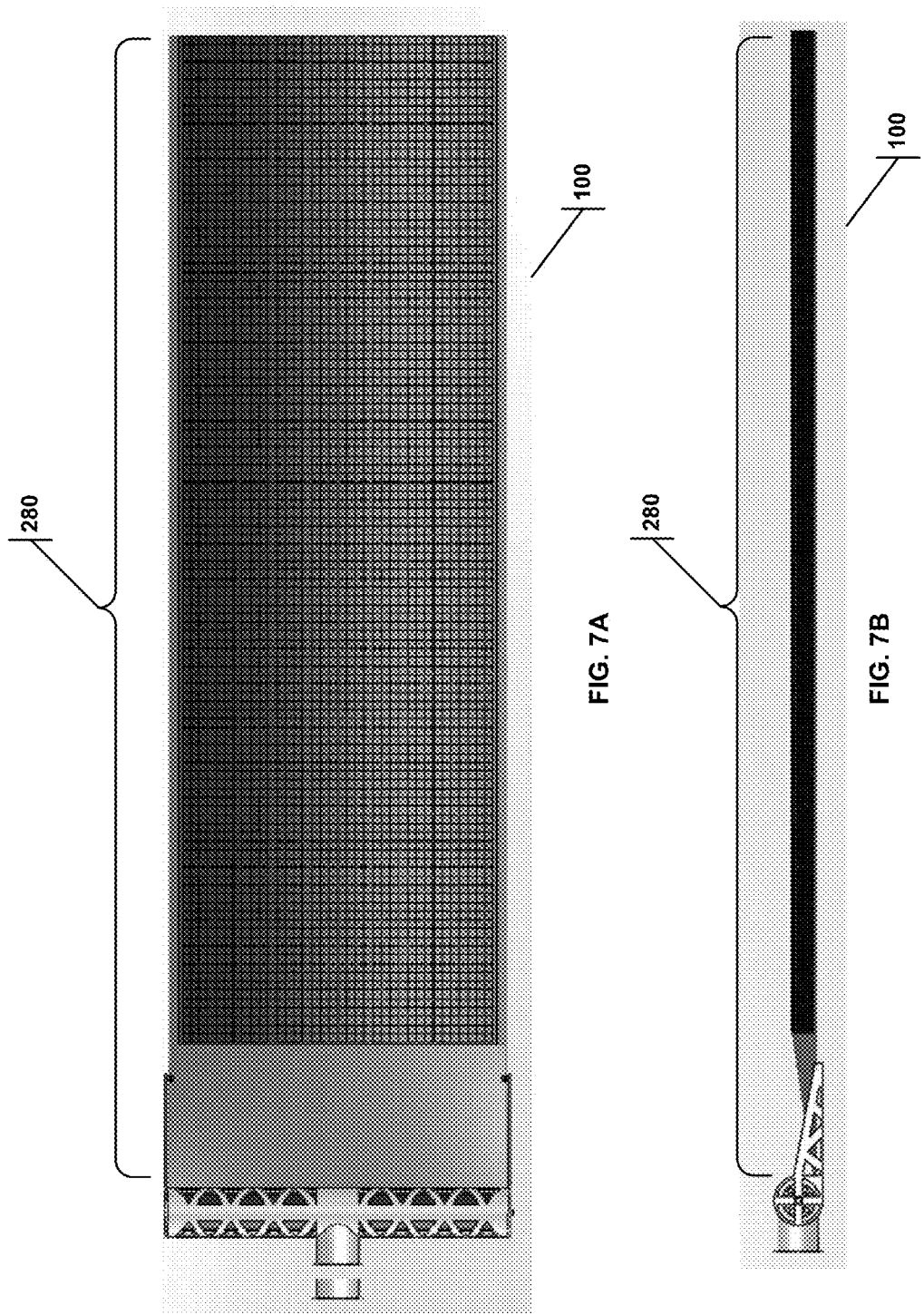
FIG. 7A is a top plan view of an example deployable boom assembly for collecting electromagnetic energy, shown in the fully deployed configuration.
FIG. 7B is a side view of the example deployable boom assembly of FIG. 7A, shown in the fully deployed configuration.

FIG. 6B shows the assembly 100 in the deployed configuration. The difference between the stowed and deployed configurations can optionally be defined by the portion of the deployable boom 110 that is deformed (for example by spooling around spool 140) and the portion 280 that is not deformed, as shown in FIGS. 7A and 7B (deployable length is 280). When the majority of the deployable length 280 is not deformed as shown in FIG. 7A, the assembly can be considered to be in a deployed configuration.

Returning briefly to FIG. 1, an example assembly 100 is shown therein in the stowed position, it being understood that the majority of the deployable length 280 is deformed and wound about the spool 140. FIG. 1 also shows that the second layer of transducers 130 may be at least partially exposed in the stowed configuration. This is helpful because in this example embodiment the spacecraft can access limited power from the exposed transducers 130 even when stowed, so that during launch the battery requirements for the spacecraft can be lowered, thereby further reducing cost and weight.

7.4 Protection of the Transducers by the Flexible Substrate.

Figure 8:
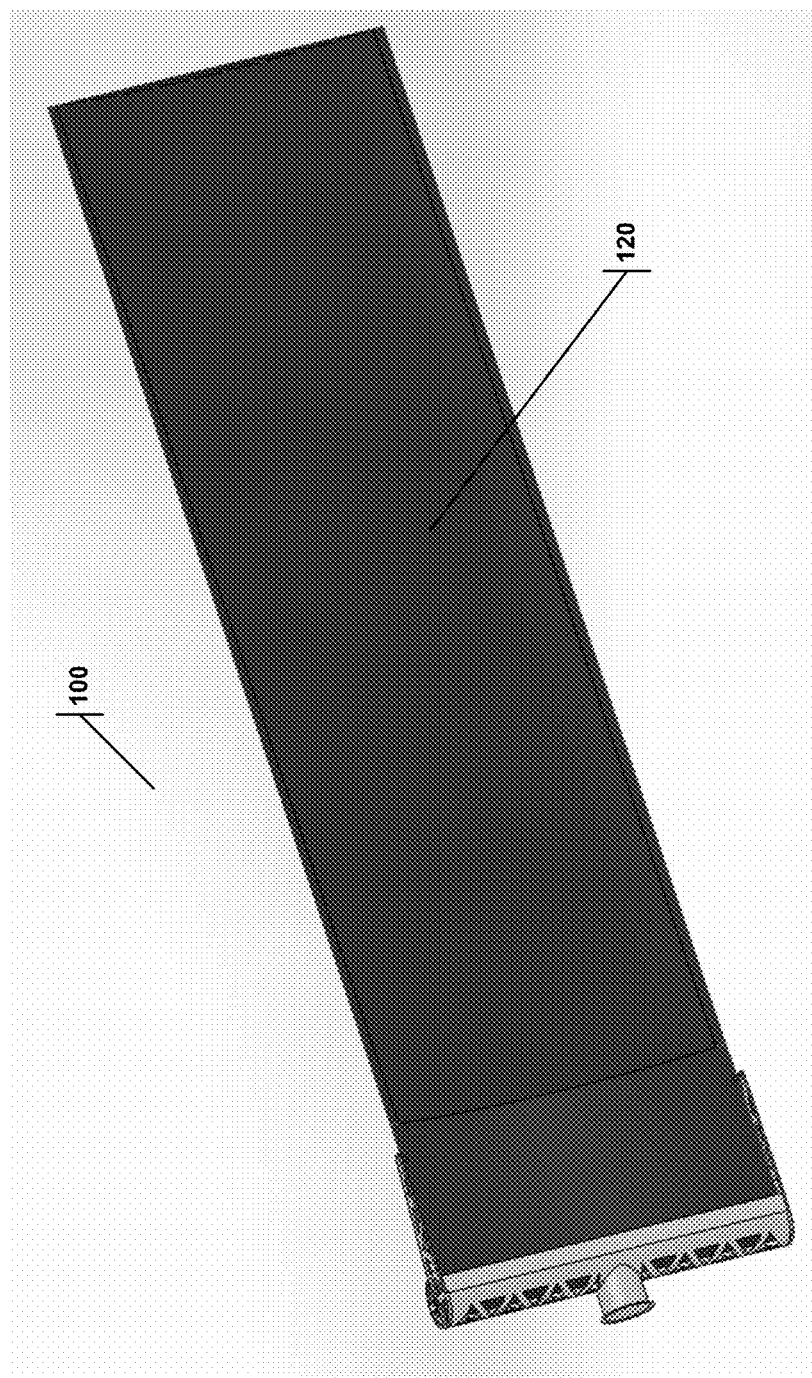
FIG. 8 is an isometric view of the example deployable boom assembly of FIG. 7A, showing the underside of the lenticular substrate in the fully deployed configuration.

FIG. 8 shows the underside of an example assembly 100 in the deployed configuration. On the opposite side (not shown) of the substrate 120 resides the second layer of transducers 130. A spacecraft will typically be exposed to various environmental conditions that can affect the efficiency of the transducers. This can include space debris that physically contacts and damages the transducers, as well as electromagnetic energy and particulate radiation, such as electrons and protons.

In past systems, solar cell blankets are typically stretched across a super-structure or scaffold, and the underside of the solar cell blanket is left exposed to the space debris, electromagnetic energy, and particulate radiation. This exposure quickly erodes the efficiency of the blanket because impingement and penetration of the unshielded backside of the layer of transducers 130 by electromagnetic energy and particulate radiation negatively affects solar cell performance.

But using a plurality of layers 120, 130 for the boom 110 as described herein tends to protect the transducers 130 and helps maintain their efficiency. Referring to FIG. 9, the transducer side 130 of the boom 110 is exposed to a solar input 290 as desired. The reverse side (i.e., the substrate side 120 of the boom 110) may be exposed to the Earth or other source of radiation 300, but a portion of that is reflected and not absorbed (as depicted by the arrow directing radiant transfer away from surface 120). Thus, compared with a fully exposed underside of a typical solar blanket (not shown), the substrate layer 120 reduces the temperature of the solar cells 130, increasing efficiency. To limit electromagnetic absorption and increase the amount of radiative transfer, the substrate layer 120 may be coated with a material 120A having spectrally appropriate reflective and emissive properties, or may include additional layers having spectrally appropriate reflective and emissive properties.

7.5 an Example Embodiment Comprising Parabolic Trough Concentrators

FIGS. 10A and 10B illustrate another example embodiment comprising a plurality of parabolic trough concentrators. Instead of the boom 110 using a transducer layer 130 that is adjacently coplanar with the substrate layer 120, an alternative second transducer layer 310 may comprise a plurality of panels 320, each extending from a proximal edge 330 to a distal edge 340. The panels 320 may comprise a reflective surface 350 and opposite the reflective surface 350 a collector surface 360 on which one or more electromagnetic transducers 370 are disposed. In various example embodiments each panel 320 is flexible and pre-formed to an approximately cylindrical, parabolic shape 380 about its own transverse axis 390. And because the panels 320 are flexible, they can be stowed by winding them about the spool 140. The panels 320 store strain energy (like a compressed spring) when they are deformed by being flattened against the substrate 120 when the substrate 120 is wound about the spool 140. The proximal edge 330 may be connected to the substrate layer 120 such that the axis 390 is substantially perpendicular to the longitudinal axis of the deployable length. When this embodiment is deployed to configuration shown in FIG. 10A, each panel 320 releases its stored strain energy by curling its distal edge 340 away from the substrate layer 120, returning to its pre-formed parabolic shape.

FIG. 10B illustrates solar input 290 impinging reflective surface 350 and reflecting via parabolic shape 380 to focus the solar input 290 onto the transducers 370, which are located approximately long the focal line 390 of the cylindrical parabolic shape 380. Because the solar input 290 is focused, it may be preferable to have a heat dissipating structure 400 such as radiator fins that radiate heat away from the transducers 370 (as indicated by arrows), thus reducing the operating temperature of the transducers 370 and increasing their efficiency.

7.6 Operation of the Deployable Boom Assembly

In many prior structures, the transducers are not designed to be stowed and redeployed. Rather, once the spacecraft is positioned, the transducers are deployed and remain fixed in-place. The presently disclosed assemblies, however, allow for booms to be stowed and re-deployed as required by the mission. For example, a communications satellite or a space telescope may need to be repositioned, but the long appendage of a deployed solar array may make such repositioning difficult. The deployed array not only changes the moment-of-inertia of the spacecraft in free space, but it can also act as a sail and frustrate repositioning efforts. Also leaving the boom deployed during a dynamic load may cause it to break. In contrast to prior system, in the present system the rotational drive mechanism can be actuated to retract the assembly into a stowed position, allowing the spacecraft to be positioned more easily and protect the boom from damage.

In the event that the positioning thrusters on the spacecraft are non-operational or insufficient for the needed repositioning, the rotational drive mechanism may actuated to deploy the boom in a less-than-fully deployed position, so that the boom can act as an adjustable sail to help position the spacecraft.

The convenient stowage of the boom is also helpful when environmental conditions may damage the spacecraft. For example, if the spacecraft is experiencing a solar storm or is on a trajectory to encounter space debris, it may be helpful to actuate the rotational drive mechanism to temporarily place the assembly in the stowed configuration. Then when environmental conditions become favorable, the assembly may be placed back into the deployed configuration.

The invention has been described in connection with specific embodiments that illustrate examples of the invention but do not limit its scope. Various example systems have been shown and described having various example aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification [be] strictly coextensive." Phillips v. AHW Corp., 415 F.3d 1303, 1323 (Fed. Cir. 2005) (en banc).

The invention claimed is:

1. An assembly for collecting electromagnetic energy comprising:
  a first layer comprising a substrate; and a second layer comprising an array of electromagnetic transducers;
  wherein the assembly comprises a deployed configuration characterized by exposing a majority of the second layer to electromagnetic energy;
  wherein the second layer further comprises:
    a plurality of panels, each in the plurality having an proximal edge and a distal edge opposite to the proximal edge, and having a reflective surface and opposite the reflective surface a collector surface on which the array of electromagnetic transducers is disposed, wherein the plurality is flexible and pre-formed to a parabolic shape and wherein the reflective surface is on the inside of the parabolic shape;
    the proximal edge is connected to the substrate and wherein in the deployed configuration, the distal edge is elevated away from the substrate by the pre-formed parabolic shape; and
    the plurality is positioned such that in the deployed configuration the reflective surface of one of the panels in the plurality focuses the electromagnetic energy onto the array of electromagnetic transducers of an adjacent panel.

2. The assembly of claim 1, wherein the plurality of panels further comprises a radiator fin.

3. The assembly of claim 1, further comprising:
  a stowed configuration characterized by shielding a majority of the second layer from electromagnetic energy; and
  a mechanism that that transforms the assembly from the stowed configuration to the deployed configuration.

4. The assembly of claim 3, wherein the second layer is positioned such that a portion of the array of electromagnetic transducers is exposed to electromagnetic energy in the stowed position.

5. The assembly of claim 1, wherein the array of electromagnetic transducers is an array of photovoltaic cells.

6. The assembly of claim 1, wherein the array of electromagnetic transducers is selected from a group consisting of: an antenna, optical sensors, and thermal sensors.

7. The assembly of claim 1, wherein the substrate provides a protective barrier to the array of electromagnetic transducers.

8. The assembly of claim 7, wherein the protective barrier shields a surface of the array of electromagnetic transducers from electromagnetic energy, particulate radiation or space objects.

9. The assembly of claim 1, wherein the substrate is selected from a group consisting of: fiberglass, metal, plastic or graphite composite materials.

10. A method of collecting electromagnetic energy on a space craft, the method comprising:
    providing an assembly for collecting electromagnetic energy, the assembly comprising:
        a first layer comprising a substrate; and a second layer comprising an array of electromagnetic transducers;
        wherein the assembly comprises a stowed configuration characterized by shielding a majority of the second layer from electromagnetic energy and a deployed configuration characterized by exposing a majority of the second layer to electromagnetic energy;
    a mechanism that that transforms the assembly from the stowed configuration to the deployed configuration;
    wherein the second layer further comprises:
        a plurality of panels, each in the plurality having an proximal edge and a distal edge opposite to the proximal edge, and having a reflective surface and opposite the reflective surface a collector surface on which the array of electromagnetic transducers is disposed, wherein the plurality is flexible and pre-formed to a parabolic shape and wherein the reflective surface is on the inside of the parabolic shape;
        the proximal edge is connected to the substrate and wherein in the deployed configuration, the distal edge is elevated away from the substrate by the pre-formed parabolic shape; and
        the plurality is positioned such that in the deployed configuration the reflective surface of one of the panels in the plurality focuses the electromagnetic energy onto the array of electromagnetic transducers of an adjacent panel;
    actuating the mechanism to place the assembly in the deployed configuration; and
    actuating the mechanism to place the assembly in the stowed configuration.

11. The method of claim 10, wherein the assembly when placed in the stowed configuration further has a portion of the array of electromagnetic transducers exposed to electromagnetic energy, the method further comprises:
    collecting electromagnetic energy from the assembly while it is in the stowed configuration; and
    powering a portion of the space craft with the collected energy.

12. The method of claim 10, further comprising:
    wherein when the assembly is in the deployed configuration, adjusting the spacecraft using the assembly as a sail.

13. The method of claim 10, wherein the assembly is placed in the stowed position to protect the array of electromagnetic transducers from environmental threats or to allow for spacecraft maneuvering.

* * * * *